(12) United States Patent
Jiang et al.

(10) Patent No.: US 7,791,879 B2
(45) Date of Patent: Sep. 7, 2010

(54) ELECTRONIC DEVICE SHELL

(75) Inventors: Hua Jiang, Shenzhen (CN);
Zhan-Sheng Lu, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

(*) Notice: Subject to any disclaimer, the term of this patent is extended or adjusted under 35 U.S.C. 154(b) by 76 days.

(21) Appl. No.: 12/340,762

(22) Filed: Dec. 22, 2008

(65) Prior Publication Data

US 2010/0027200 A1    Feb. 4, 2010

(30) Foreign Application Priority Data

Jul. 31, 2008    (CN) .................. 2008 1 0303261

(51) Int. Cl.
*G06F 1/16*    (2006.01)
(52) U.S. Cl. .................. 361/679.58; 174/256; 312/325; 365/185.13; 439/892
(58) Field of Classification Search .................. 174/50, 174/256, 541; 361/679.58, 679.09, 679.02, 361/679.41, 679.16, 679.55, 679.01, 679.17; 312/223.1, 325, 31, 333; 429/97, 100; 365/155.01, 365/185.13, 222; 439/64, 892, 352
See application file for complete search history.

(56) References Cited

U.S. PATENT DOCUMENTS

| | | | |
|---|---|---|---|
| 7,227,741 B2* | 6/2007 | Garel et al. ............. | 361/679.27 |
| 2009/0190306 A1* | 7/2009 | Tang ..................... | 361/679.58 |
| 2010/0089604 A1* | 4/2010 | Tang ..................... | 174/50 |
| 2010/0090568 A1* | 4/2010 | Tang ..................... | 312/223.1 |
| 2010/0092847 A1* | 4/2010 | Li ....................... | 429/97 |

* cited by examiner

*Primary Examiner*—Hung V Duong
(74) *Attorney, Agent, or Firm*—Frank R. Niranjan

(57) ABSTRACT

A shell of an electronic device includes a front cover, a rear cover, and a latching assembly. The front cover includes two first sidewalls. The rear cover includes two first borders. The latching assembly includes two first latching members, two spacers, and two groups of second latching members. The first latching members define a number of latch-receiving portions. The first latching members are fixed to the inner surface of first sidewall with a corresponding spacer intervened therebetween. The second latching member is mounted to the inner surface. Each of the second latching members includes a sliding pole and a cap. Each of the latch-receiving portion includes a sliding portion forming an entrance for a corresponding second latching member sliding into the latch-receiving portion, and a latching portion communicating with the sliding portion, which is an elongate slot parallel to the length direction of the first latching member.

20 Claims, 7 Drawing Sheets

ELECTRONIC DEVICE SHELL

BACKGROUND

1. Technical Field

The present disclosure relates to an electronic device shell.

2. Description of the Related Art

The developed trends for shells of electronic devices such as LCDs, mobile phones and personal digital assistants are: small size, light weight, and easy assembly and disassembly. However, current electronic device shells, which typically include a rear cover and a front cover, commonly combine the rear and front covers using threaded fasteners. For example, the rear and front covers define a set of threaded holes, and a set of mating short screws is employed to assemble the rear and front covers together. However, screwing and unscrewing the threaded fasteners are inconvenient.

Therefore, what is desired is an electronic device shell that can overcome the above described problem.

BRIEF DESCRIPTION OF THE DRAWINGS

Many aspects of the present electronic device shell should be better understood with reference to the accompanying drawings. The components in the drawings are not necessarily drawn to scale, the emphasis instead being placed upon clearly illustrating the principles of the electronic device shell. Moreover, in the drawings, like reference numerals designate corresponding parts throughout the several views.

DETAILED DESCRIPTION

Embodiments of the present electronic device shell will be now described in detail with reference to the drawings.

Figure 1:
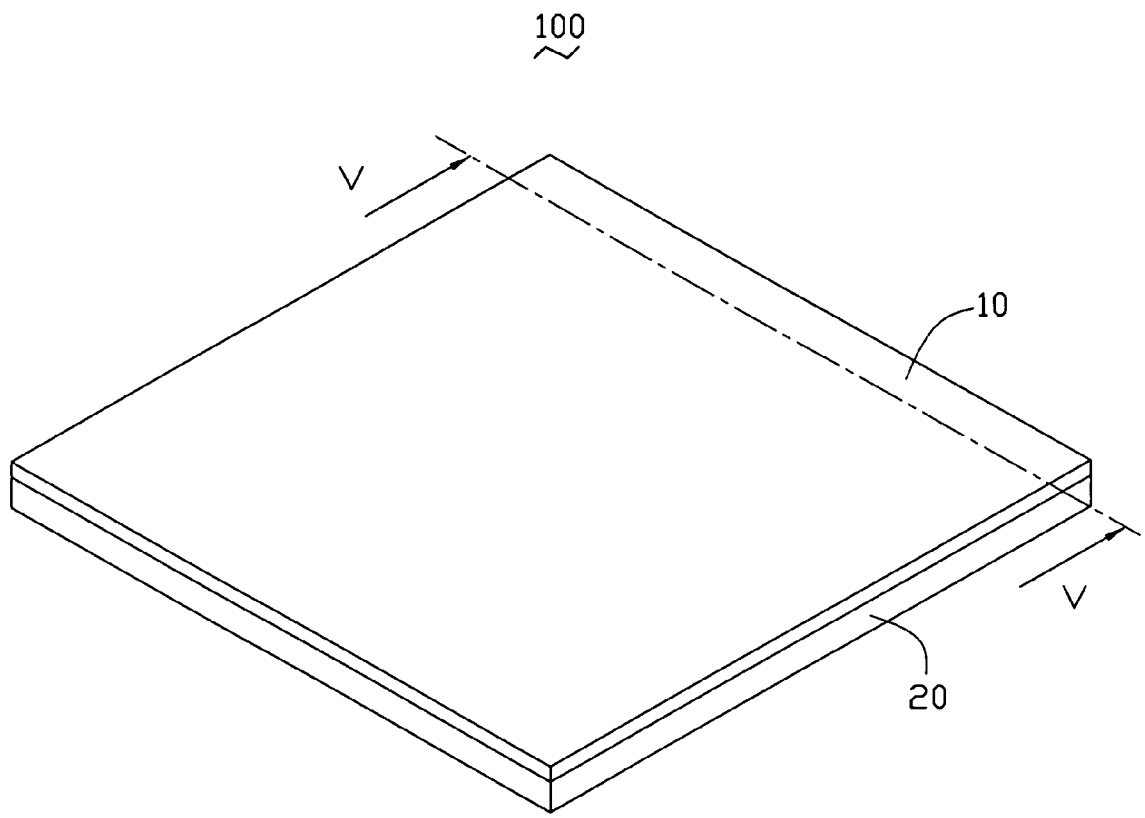
FIG. 1 is an assembled, isometric view of an electronic device shell which includes a front cover, according to an exemplary embodiment.
Figure 2:
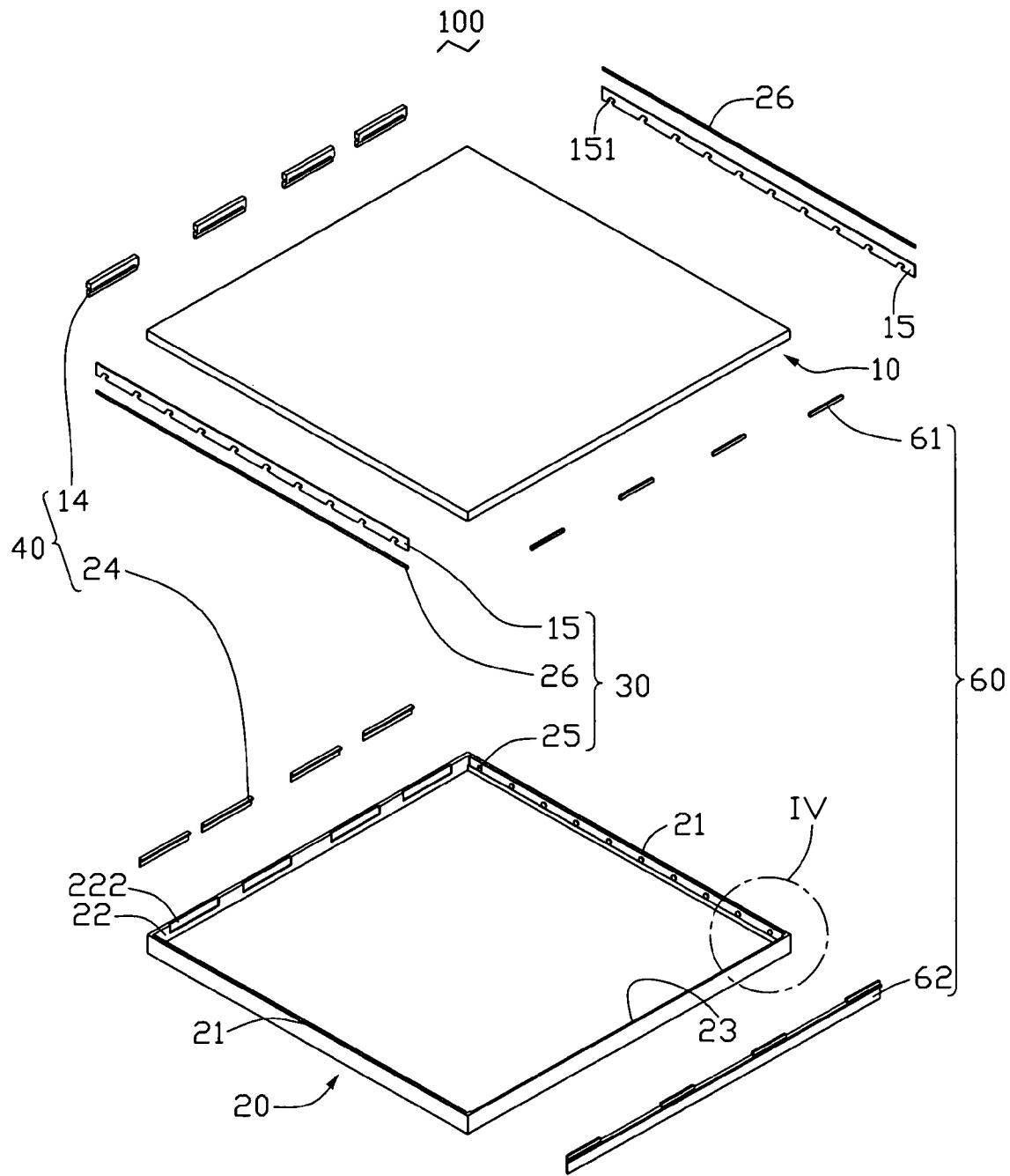
FIG. 2 is an exploded, isometric view of the electronic device shell of FIG. 1.

Referring to FIGS. 1-2, an electronic device shell 100 in accordance with an exemplary embodiment is illustrated. The electronic device shell 100 includes a front cover 10, a rear cover 20, and a latching assembly 30. The latching assembly 30 is configured for latching the front cover 10 and the rear cover 20 together.

Figure 3:
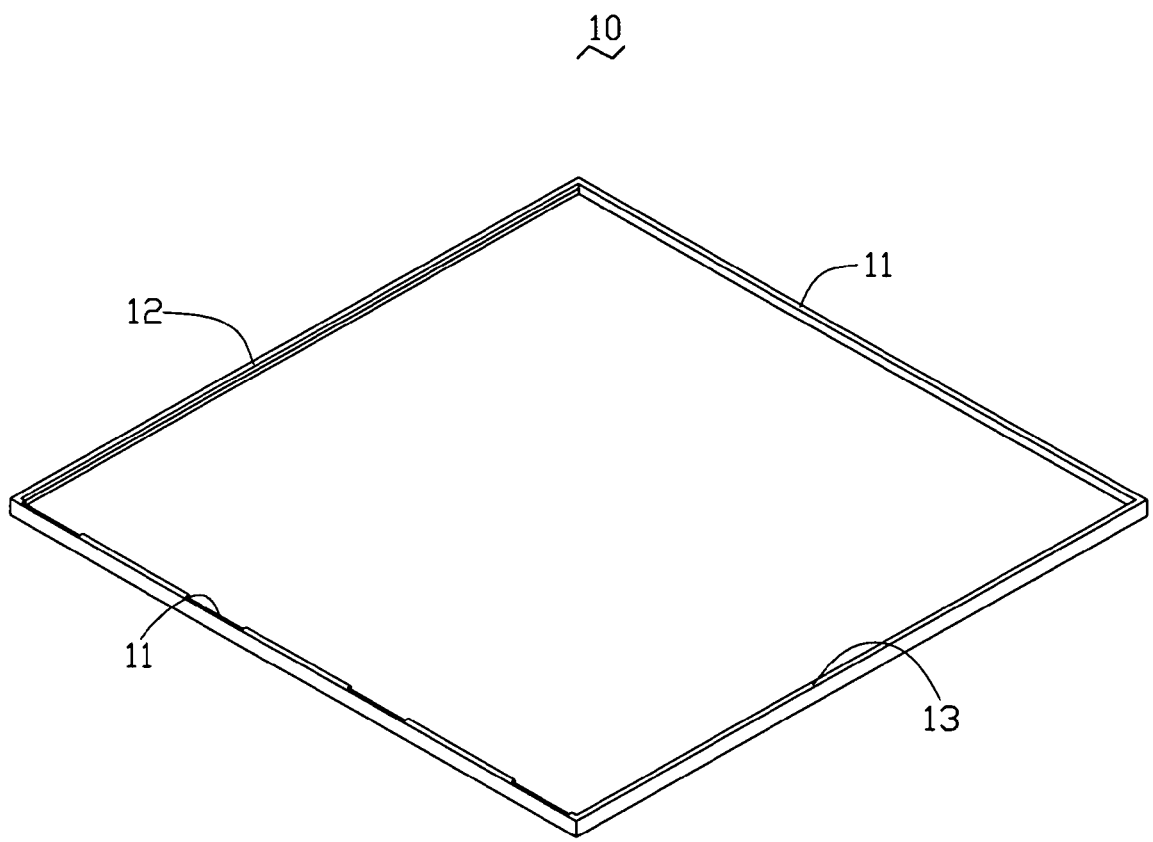
FIG. 3 is an isometric view of the front cover of FIG. 1, viewed from another angle.

Also referring to FIG. 3, the front cover 10 is rectangular in shape and includes two first sidewalls 11 facing away from each other, a second sidewall 12, and a third sidewall 13.

Referring back to FIG. 2, the rear cover 20 is also rectangular in shape, and includes two first borders 21 facing away from each other, a second border 22, and a third border 23.

Figure 4:
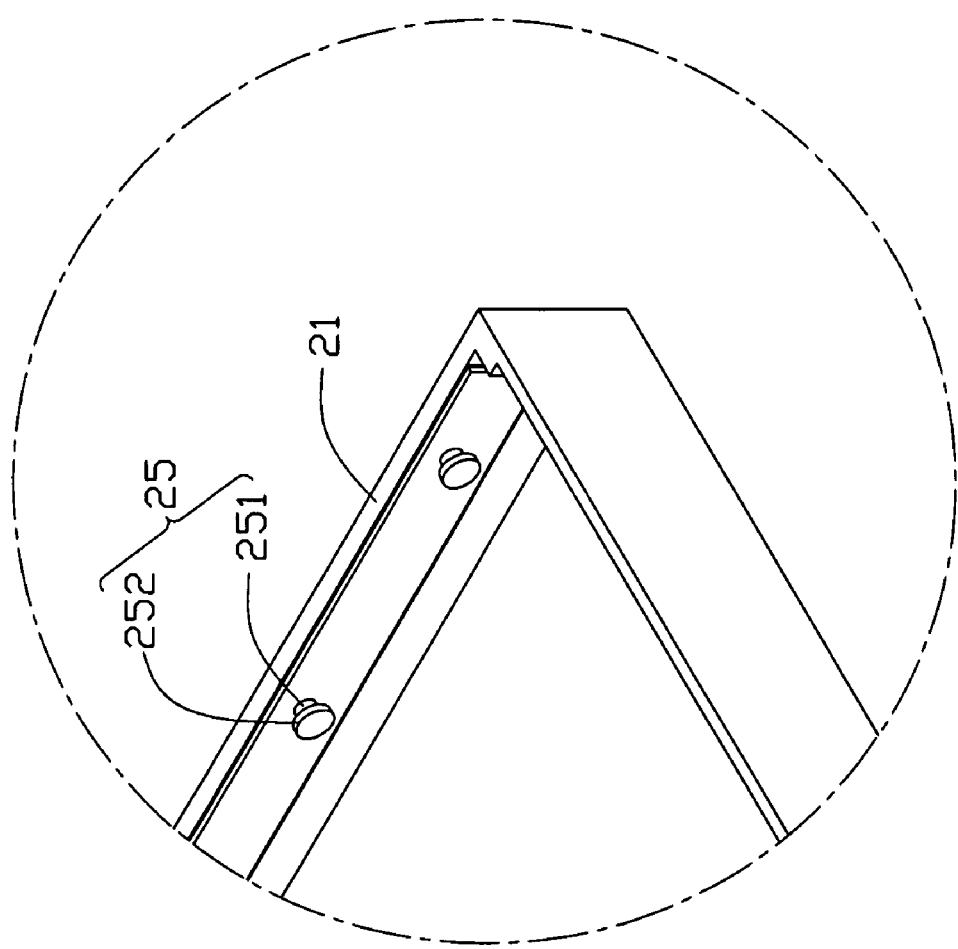
FIG. 4 is an enlarged view of a portion IV of FIG. 2.
Figure 5:
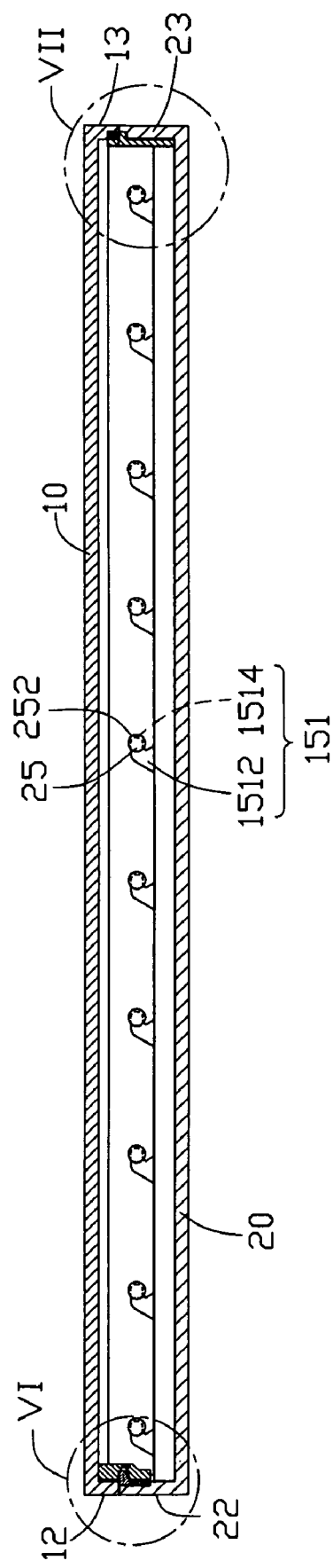
FIG. 5 is a cross-sectional view taken along line V-V of FIG. 1.
Figure 6:
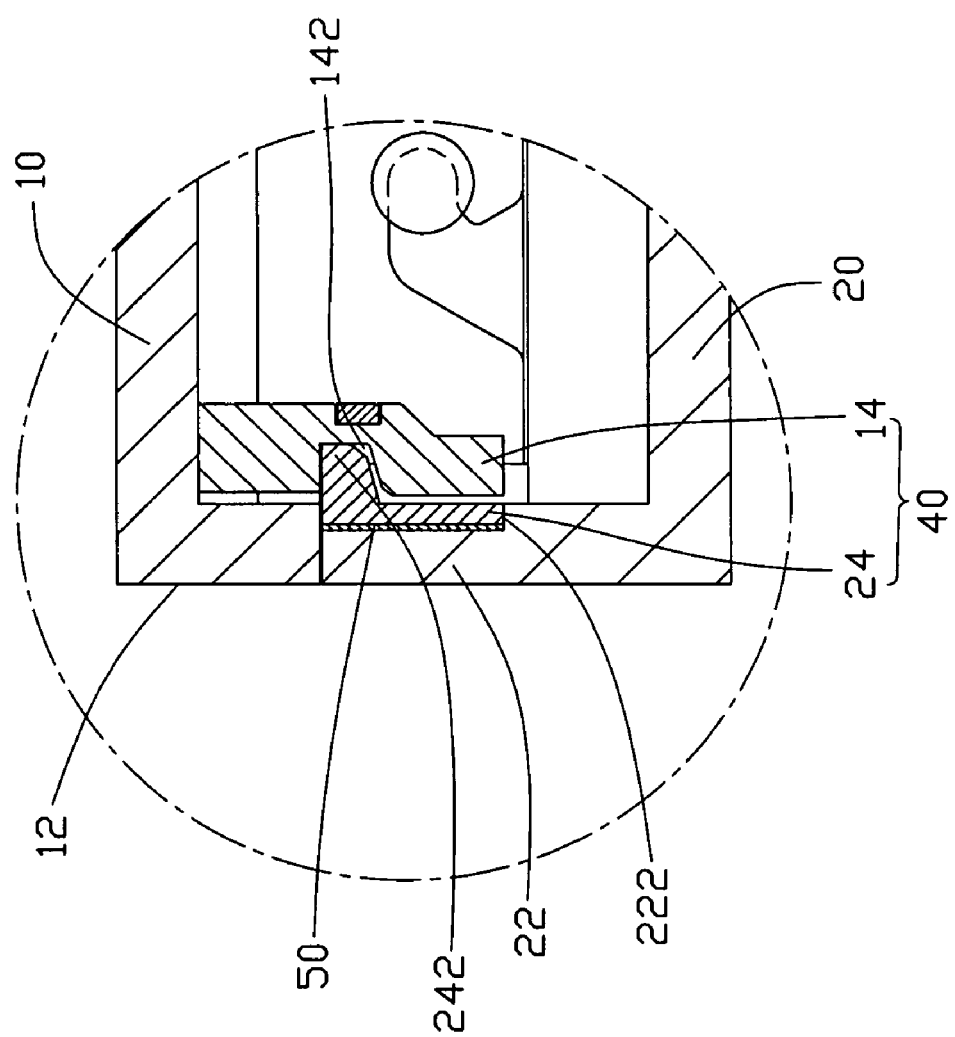
FIG. 6 is an enlarged view of a portion VI of FIG. 5.

Also referring to FIGS. 4-6, the latching assembly 30 includes two first latching members 15, two groups of second latching members 25, and two spacers 26. Each of the first latching members 15 is a strip-shaped sheet defining a number of latch-receiving portions 151 at its longer edges. The first latching members 15 are fixed to the inner surface of a corresponding first sidewall 11 of the front cover 10, with a corresponding spacer 26 intervened therebetween, using adhesive (not shown). The first latching members 15, the spacers 26, and the first sidewalls 11 of the front cover 10 are parallel to each other. The height of the spacer 26 is less than that of the first latching member 15. The first latching member 15 is placed so that the spacers 26 are not between the latch-receiving portion 151 of the first latching member 15 and the corresponding first sidewall 11 of the front cover 10.

Each of the two groups of second latching members 25 are fixed to the inner surface of a corresponding one of the first borders 21. Each of the second latching members 25 includes a sliding pole 251 with one end fixed to the corresponding first border 21 and a cap 252 formed on the free distal end of the sliding pole 251. Each of the latch-receiving portions 151 includes a sliding portion 1512, adjacent to the edge of one of the first latching members 15 and thereby forming an entrance for a corresponding second latching member 25 entering into the latch-receiving portion 151, and a latching portion 1514 communicating with the sliding portion 1512, which is an elongated slot extending lengthwise along the first latching member 15.

When assembling, the front cover 10 is first aligned with the rear cover 20, so that each of the sliding poles 251 of the second latching members 25 enters into and slides in the sliding portion 1512 to the latching portion 1514. Then the front cover 10 is pushed to slide along the extending direction of the latching portion 1514, latching the front cover 10 to the rear cover 20 by engagement between the sliding poles 251 and the latching portion 1514. The diameter of the caps 252 is greater than the width of the latching portion 1514, and as a result, after the second latching members 25 slide into the latching portions 1514, the caps 252 prevent the second latching member 25 from disengaging from the latching portions.

It should be noted that the number of the group of the second latching member 25 is not limited to two, but can be any number depending on requirements.

Referring back to FIG. 2, in other embodiments, the electronic device shell 100 may further include a first auxiliary latching assembly 40 and a second auxiliary latching assembly 60, for enhancing the strength of the connection between the front and rear covers 10, 20.

Referring to FIG. 6, The inner surface of the second border 22 defines four grooves 222. The first auxiliary latching assembly 40 includes four first magnetic members 14 fixed to the inner surface of the second sidewall 12 of the front cover 10, and four second magnetic members 24, each aligned with a corresponding first magnetic members 14 and fixed to a corresponding groove 222 of second border 22 of the rear cover 20 via adhesive 50. Each of the first magnetic members 14 defines a slot 142 facing the second sidewall 12. Each of the second magnetic members 24 defines a projection 242 aligned with and protruded into a corresponding one of the slots 142. The first and second magnetic members 14, 24 are magnetized so that when the electronic device shell 100 is assembled they attract each other.

Figure 7:
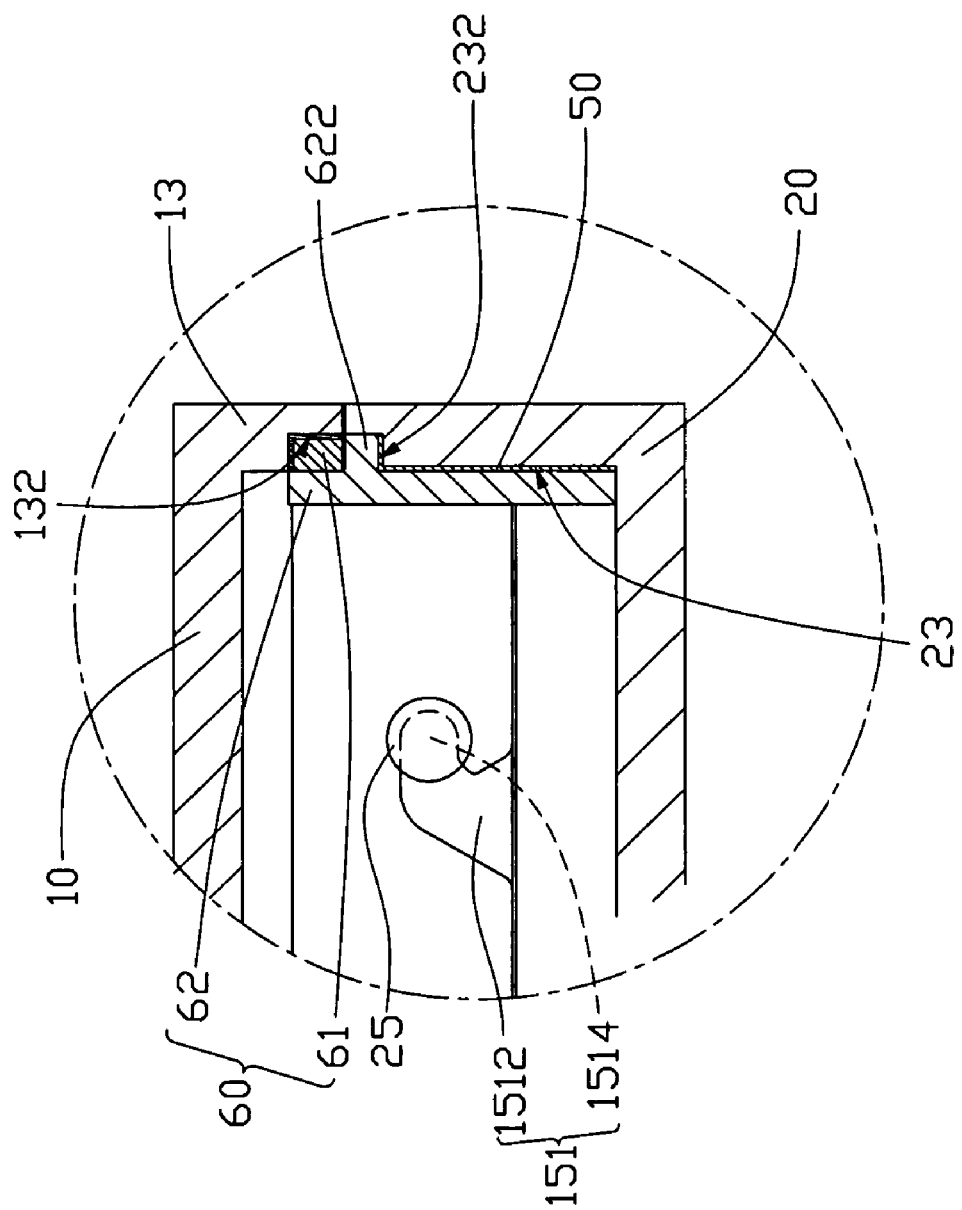
FIG. 7 is an enlarged view of a portion VII of FIG. 5.

Referring to FIG. 7, the inner surface of the third sidewall 13 defines four receiving portions 132 therein. The inner surface of the third border 23, which corresponds to the third sidewall 13 of the front cover 10, defines four recesses 232 therein corresponding to the four receiving portions 132. The second auxiliary latching assembly 60 includes four third magnetic members 61 correspondingly fixed in the four receiving portions 132 of the third sidewall 13 of the front cover 10 via adhesive 50, and four fourth magnetic members 62 fixed to the third border 23 of the rear cover 20 via adhesive 50 corresponding to the four third magnetic members 61. The third and fourth magnetic members 61, 62 are magnetized so that when the electronic device shell 100 is assembled they attract each other. In this embodiment, each of the fourth magnetic members 62 defines a flange 622 correspondingly aligned with and protruding into a corresponding recess 232.

It should be noted that the number of the first magnetic members 14, the second magnetic members 24, third magnetic members 61, and the fourth magnetic members 62 are not limited to four, but can be one, two, three or more than four, based on requirements.

Thereby, when the front cover 10 is latched to the rear cover 20, the first and second magnetic members 14, 24 magnetically attract each other. The third magnetic members 61 and the fourth magnetic members 62 can magnetically attract each other. The mating structures of 142, 242,132, 232, 622 can enhance the strength between the 12, 14, 24, and 22, and 13, 61, 62, and 23.

It will be understood that the above particular embodiments and methods are shown and described by way of illustration only. The principles and the features of the present invention may be employed in various and numerous embodiments thereof without departing from the scope of the invention as claimed. The above-described embodiments illustrate the scope of the invention but do not restrict the scope of the invention.

What is claimed is:

1. A shell of an electronic device, comprising:
    a front cover comprising two first sidewalls facing away each other;
    a rear cover comprising two first borders facing away from each other and corresponding to the two first sidewalls;
    a latching assembly comprising:
    two strip-shaped first latching members, each defining a plurality of latch-receiving portions at its longer edge;
    two spacers, each of the first latching members being fixed to the inner surface of a corresponding first sidewall with a corresponding spacer intervened therebetween to space the latch-receiving portions and the first sidewall; and
    two groups of second latching members each fixed to the inner surface of a corresponding first borders, each of the second latching members comprising a sliding pole fixed to the corresponding first border and a cap formed on the free distal end of the sliding pole, each of the latch-receiving portion comprising a sliding portion adjacent to the longer edge of the first latching member for a corresponding second latching member sliding into the latch-receiving portion, and a latching portion communicating with the sliding portion for latching the corresponding latching member thereat.

2. The shell of an electronic device as claimed in claim 1, wherein the first latching members, the spacers, and the first sidewalls of the front cover are parallel to each other.

3. The shell of an electronic device as claimed in claim 2, wherein the latching portion is an elongated slot extending lengthwise along the first latching member.

4. The shell of an electronic device as claimed in claim 1, wherein the height of the spacer is less than that of the first latching member.

5. The shell of an electronic device as claimed in claim 1, wherein the diameter of the caps is greater than the width of the latching portion.

6. The shell of an electronic device as claimed in claim 5, wherein each of the first magnetic members defines a slot facing the second sidewall, each of the second magnetic member defines a projection aligned with and protrudes into a corresponding slot.

7. A shell of an electronic device, comprising:
    a front cover comprising two first sidewalls facing away from each other, and a second sidewall;
    a rear cover comprising two first borders facing away from each other, and a second border;
    a latching assembly comprising:
    two strip-shaped first latching members, each defining a plurality of latch-receiving portions at its longer edge;
    two spacers, each of the first latching members being fixed to the inner surface of a corresponding first sidewall with a corresponding spacer intervened therebetween to space the latch-receiving portions and the first sidewall; and
    two groups of second latching members each fixed to the inner surface of a corresponding first borders, each of the second latching members comprising a sliding pole fixed to the corresponding first border and a cap formed on the free distal end of the sliding pole, each of the latch-receiving portion comprising a sliding portion adjacent to the longer edge of the first latching member for a corresponding second latching member sliding into the latch-receiving portion, and a latching portion communicating with the sliding portion for latching the corresponding latching member thereat; and
    a first auxiliary latching assembly comprising:
    two or more first magnetic members fixed to the inner surface of the second sidewall of the front cover;
    two or more second magnetic members fixed to the inner surface of the second border of the rear cover.

8. The shell of an electronic device as claimed in claim 7, wherein the first latching members, the spacers, and the first sidewalls of the front cover are parallel to each other.

9. The shell of an electronic device as claimed in claim 8, wherein the latching portion is an elongated slot extending lengthwise along the first latching member.

10. The shell of an electronic device as claimed in claim 7, wherein the height of the spacer is less than that of the first latching member.

11. The shell of an electronic device as claimed in claim 7, wherein the diameter of the caps is greater than the width of the latching portion.

12. The shell of an electronic device as claimed in claim 7, wherein the first and the second magnetic members have opposite polarities.

13. A shell of an electronic device, comprising:
    a front cover comprising two first sidewalls facing away from each other, a second sidewall and a third sidewall;
    a rear cover comprising two first borders facing away from each other, a second border and a third border;
    a latching assembly comprising:
    two strip-shaped first latching members, each defining a plurality of latch-receiving portions at one of its longer edge;
    two spacers, each of the first latching members being fixed to the inner surface of a corresponding first sidewall with a corresponding spacer intervened therebetween to space the latch-receiving portions and the first sidewall; and
    two groups of second latching members each fixed to the inner surface of a corresponding first borders, each of the second latching members comprising a sliding pole fixed to the corresponding first border and a cap formed on the free distal end of the sliding pole, each of the latch-receiving portion comprising a sliding portion adjacent to the longer edge of the first latching member for a corresponding second latching member sliding into the latch-receiving portion, and a latching portion communicating with the sliding portion for latching the corresponding latching member thereat; and a first auxiliary latching assembly comprising:
more than one first magnetic member fixed to the inner surface of the second sidewall of the front cover;
more than one second magnetic member fixed to the inner surface of the second border of the rear cover; and
a second auxiliary latching assembly comprising:
a third magnetic member mounted on the inner surface third border of the rear cover; and
a fourth magnetic member fixed in the receiving portion of the third sidewall of the front cover.

14. The shell of an electronic device as claimed in claim 13, wherein the first latching members, the spacers, and the first sidewalls of the front cover are parallel to each other.

15. The shell of an electronic device as claimed in claim 14, wherein the first latching portion is an elongated slot extending lengthwise along the first latching member.

16. The shell of an electronic device as claimed in claim 13, wherein the height of the spacer is less than that of the first latching member.

17. The shell of electronic device as claimed in claim 13, wherein the diameter of the caps is greater than the width of the latching portion.

18. The shell of an electronic device as claimed in claim 13, wherein each of the first magnetic members defines a slot facing the second sidewall, each of the second magnetic member defines a projection aligned with and protruded to a corresponding slot.

19. The shell of an electronic device as claimed in claim 13, wherein the inner surface of the third sidewall of the front cover defines a plurality of receiving portions, the third magnetic members are correspondingly fixed in the receiving portions.

20. The shell of an electronic device as claimed in claim 13, wherein the third border of the rear cover defines a plurality of recesses, each of the fourth magnetic members defines a flange correspondingly aligned with and protrudes into each of the corresponding plurality of recesses.

* * * * *